(12) United States Patent
Mimura et al.

(10) Patent No.: US 10,062,846 B2
(45) Date of Patent: Aug. 28, 2018

(54) DISPLAY DEVICE

(71) Applicant: Japan Display Inc., Minato-ku (JP)

(72) Inventors: Toshifumi Mimura, Minato-ku (JP);
Masahiro Watabe, Minato-ku (JP);
Toshihiro Sato, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/297,567

(22) Filed: Oct. 19, 2016

(65) Prior Publication Data
US 2017/0133594 A1    May 11, 2017

(30) Foreign Application Priority Data

Nov. 5, 2015 (JP) ................. 2015-217895

(51) Int. Cl.
| | |
|---|---|
| *H01L 51/52* | (2006.01) |
| *H01L 51/00* | (2006.01) |
| H01L 51/50 | (2006.01) |
| H01L 27/32 | (2006.01) |

(52) U.S. Cl.
CPC ...... *H01L 51/0018* (2013.01); *H01L 51/5253* (2013.01); *H01L 27/3246* (2013.01); *H01L 27/3258* (2013.01); *H01L 51/5012* (2013.01); *H01L 51/5237* (2013.01); *H01L 2227/323* (2013.01)

(58) Field of Classification Search
CPC . H01L 51/52; H01L 51/5253; H01L 51/0018; H01L 51/5237; H01L 51/5012
See application file for complete search history.

(56) References Cited

U.S. PATENT DOCUMENTS

| | | | |
|---|---|---|---|
| 2005/0023964 A1 | 2/2005 | Omura et al. | |
| 2015/0054006 A1* | 2/2015 | Okumura | H01L 51/56 257/89 |
| 2015/0187989 A1* | 7/2015 | Sato | H01L 27/322 257/98 |
| 2016/0043349 A1* | 2/2016 | Park | H01L 51/5271 257/40 |
| 2016/0372709 A1* | 12/2016 | Lee | H01L 51/5268 |

FOREIGN PATENT DOCUMENTS

| | | |
|---|---|---|
| JP | 2004-335267 | 11/2004 |
| JP | 2006-302860 | 11/2006 |

* cited by examiner

*Primary Examiner* — Phuc Dang
(74) *Attorney, Agent, or Firm* — Oblon, McClelland, Maier & Neustadt, L.L.P.

(57) ABSTRACT

A manufacturing method of a display device includes: forming, in a resin layer including a display area where a plurality of lower electrodes is formed and a peripheral area surrounding the display area, a band-like groove which divides the resin layer in a form of surrounding the display area; forming an organic electroluminescence layer including a light emitting layer, on the resin layer and inside the band-like groove in such a way as to be placed on the plurality of lower electrodes; irradiating the organic electroluminescence layer with a pulse laser and thus eliminating the organic electroluminescence layer in such a way that a part of the organic electroluminescence layer is left in a shape of an island at least on a bottom surface of the band-like groove and that the bottom surface of the band-like groove is continuously exposed in the form of surrounding the display area.

2 Claims, 24 Drawing Sheets

DISPLAY DEVICE

CROSS-REFERENCE TO RELATED APPLICATION

The present application claims priority from Japanese application JP2015-217895 filed on Nov. 5, 2015, the content of which is hereby incorporated by reference into this application.

BACKGROUND OF THE INVENTION

1. Field of the Invention

The present invention relates to a manufacturing method of a display device and a display device.

2. Description of the Related Art

In a display device such as an organic EL (electroluminescence) display device, a self-light emitting element such as an organic light emitting diode (OLED) may be controlled using a switching element such as a transistor, thus displaying an image. Here, an organic material used for the organic light emitting diode may react with water and oxygen and thus deteriorate. Therefore, the organic EL panel may be sealed so that the organic material will not be exposed to the outside air.

JP2006-392860A discloses an EL element which includes an organic material film formed independently for each pixel and having a flat part and a slope part.

JP2004-335267A discloses an organic EL display device which has an organic insulating film divided by a division area provided between a seal member and a pixel area.

SUMMARY OF THE INVENTION

Water and oxygen may enter from a frame area of the display device, pass through the inside of an organic film formed over a display area and the frame area, and thus reach the display area. Therefore, a structure in which the organic film around the display area is eliminated to prevent the entry of water and oxygen into the organic film formed in the display area may be employed.

The elimination of the organic film may be carried out by laser ablation. In that case, the laser irradiation area increases according to the size of the display area and therefore the cost of eliminating the organic film increases. Also, as the laser irradiation area increases, properties of the organic film may deteriorate due to heat from the irradiation, and the quality of the display device may deteriorate due to the scattering of the eliminated organic film.

Thus, it is an object of the invention to provide a manufacturing method of a display device and a display device in which the increase in the laser irradiation area is restrained even in the case of eliminating the organic film by laser ablation.

According to an aspect of the invention, a manufacturing method of a display device includes: forming, in a resin layer including a display area where a plurality of lower electrodes is formed and a peripheral area surrounding the display area, a band-like groove which divides the resin layer in a form of surrounding the display area; forming an organic electroluminescence layer including a light emitting layer, on the resin layer and inside the band-like groove in such a way as to be placed on the plurality of lower electrodes; irradiating the organic electroluminescence layer with a pulse laser and thus eliminating the organic electroluminescence layer in such a way that a part of the organic electroluminescence layer is left in a shape of an island at least on a bottom surface of the band-like groove and that the bottom surface of the band-like groove is continuously exposed in the form of surrounding the display area; forming an upper electrode on the organic electroluminescence layer; and forming a sealing layer in such a way as to cover the organic electroluminescence layer.

According to another aspect of the invention, a display device includes: a resin layer which includes a display area where a plurality of lower electrodes is formed and a peripheral area surrounding the display area, and which has a band-like groove dividing a part surrounding the display area; an organic electroluminescence layer which is formed in the display area and the peripheral area in such a way as to be placed on the plurality of lower electrodes and which includes a light emitting layer; an upper electrode formed on the organic electroluminescence layer; and a sealing layer formed in such a way as to cover the organic electroluminescence layer. The organic electroluminescence layer is arranged in an inside and an outside of the band-like groove so as to be divided by a boundary of the inside and the outside of the band-like groove and is left in a shape of an island on a bottom surface of the band-like groove.

DETAILED DESCRIPTION OE THE INVENTION

Hereinafter, each embodiment of the invention will be described with reference to the drawings. However, the disclosure is only an example, and as a matter of course, any change that can be easily thought of by a person skilled in the art without departing from the spirit of the invention should be included in the scope of the invention. In order to clarify the explanation, the drawings may schemaitcally show each part in terms of its width, thickness, shape and the like, compared with the actual Configuration. However, this is simply an example and should not limit the interpretation of the invention. Also, elements similar to those described before with reference to already mentioned drawings may be denoted by the same reference signs, and detailed description of these elements may be omitted when appropriate.

Figure 1:
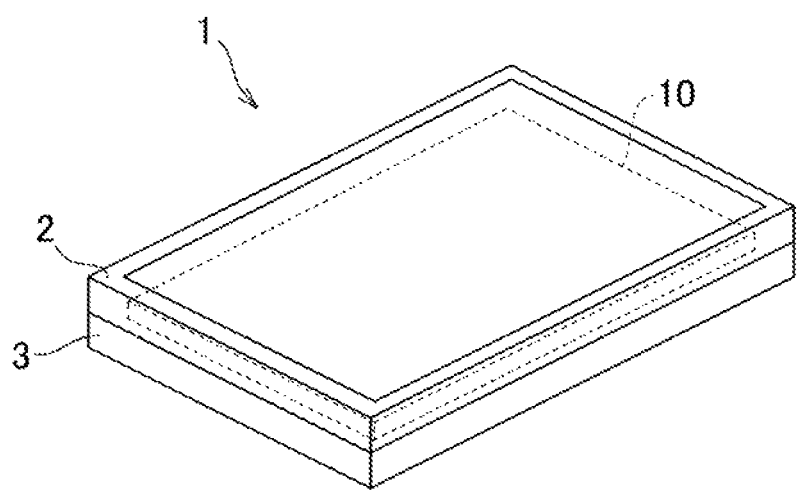
FIG. 1 is a perspective view of a display device according to an embodiment of the invention.

FIG. 1 is a perspective view showing a display device 1 according to an embodiment of the invention. The display device 1 includes a display panel 10 fixed in such a way as to be held between an upper frame 2 and a lower frame 3.

Figure 2:
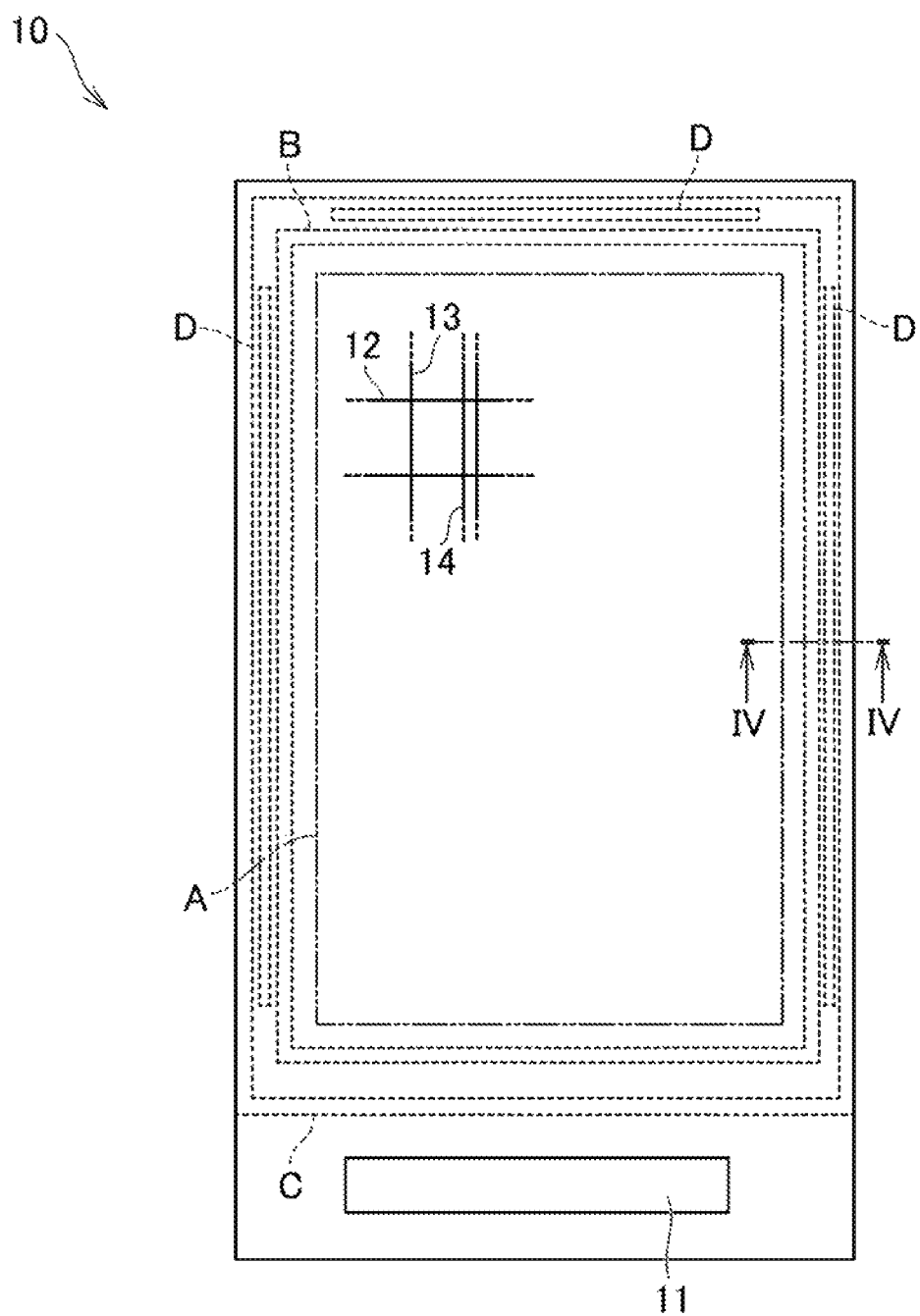
FIG. 2 is a top view of a display panel according to the embediment of the invention.

FIG. 2 is a top view of the display panel 10 according to the first embodiment of the invention. The display panel 10 has a plurality of pixels provided in a matrix form in a display area A, and controls the pixels to display an image. Each pixel is formed in an area surrounded by two neighboring scanning lines 12, a video signal line 13, and a power line 14. The display area A has its peripheries surrounded by a first band area B. The first band area 8 is surrounded by a second band area C. A contact area D is provided between the first band area B and the second band area C. Here, the first band area B is an area where a groove provided to prevent the entry of moisture or the like from outside is formed. The second band area C is an area where a seal member is provided to bond two substrates together. The contact area D is an area where an upper electrode and a common electrode are electrically connected to each other. The display panel 10 has a terminal 11 which is electrically connected to an external device of the display panel 10. The terminal 11 is formed outside the area surrounded by the second band area C and is exposed without being covered by the counter substrate.

Figure 3:
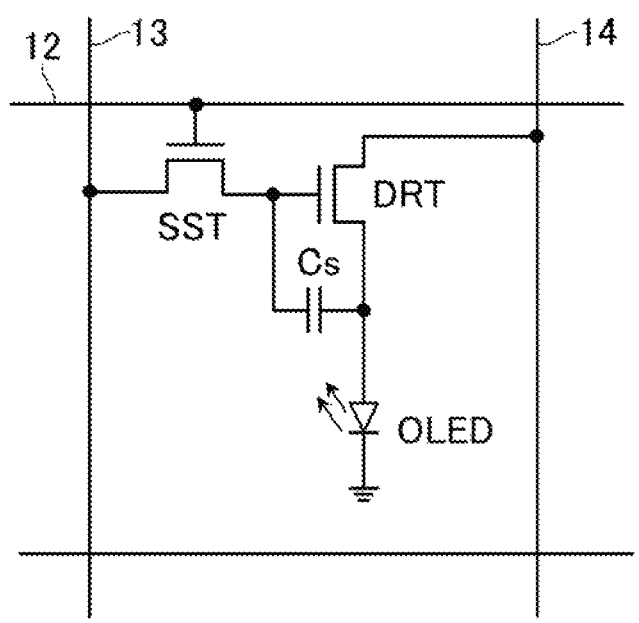
FIG. 3 is an equivalent circuit diagram of a pixel of the display panel according to the embodiment of the invention.

FIG. 3 is an equivalent circuit diagram of a pixel in the display panel 10 according to the embodiment of the invention. The scanning line 12 transmitting a signal from a scanning signal drive circuit is electrically connected to the gate of a pixel transistor SST formed in the pixel. The scanning line 12 is shared by pixel transistors arranged in one row. The video signal line 13 transmitting a signal from a video signal drive circuit is electrically connected to the source of the pixel transistor SST. The video signal line 13 is shared by pixel transistors arranged in one column. The drain of the pixel transistor SST is electrically connected to the gate of a drive transistor DRT and a storage capacitor Cs. The drain of the drive transistor DRT is electrically connected to the power line 14, and its source is electrically connected to the anode of an organic light, emitting diode OLED. The other end of the storsge capacitor Cs is electrically connected to the source or the drive transistor DRT. The cathode of the organic light emitting diode OLED is electrically connected to a grounding wire (common electrode).

When a scanning signal is applied to the scanning line 12, the pixel transistor SST switches on. When a video signal voltage is applied to the video signal line 13 in that state, a video signal voltage is written into the storage capacitor Cs, and the video signal voltage is applied to the gate of the drive traxisistor DRT, thus switching on the drive transistor DRT. A power-supply voltage to cause the organic light emitting diode OLED to emit light is applied to the power line 14 electrically connected to the drain of the drive transistor DRT. As the drive transistor DRT switches on, a current corresponding to the magnitude of the video signal voltage flows to the organic light emitting diode OLED. The organic light emitting diode OLED is formed by an organic electroluminescence layer including a light emitting layer. As the current flows to the light emitting layer, the recombination of holes and electrons excites the light emitting material, and the light emitting material emits light when shifting to a lower level.

Figure 4:
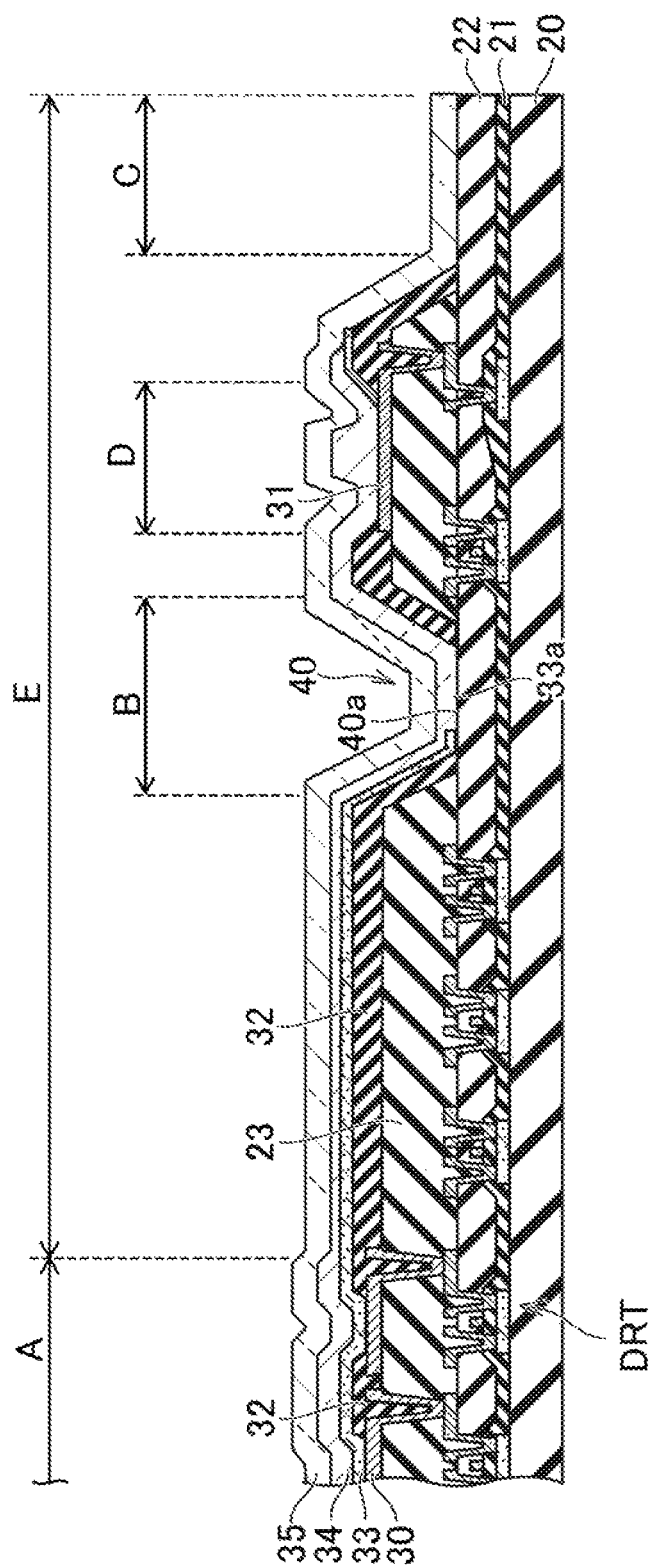
FIG. 4 is a cross-sectional view of the display panel according to the embodiment of the invention.

FIG. 4 is a cross-sectional view of the display panel 10 according to the embodiment of the invention. FIG. 4 shows a cross section taken along IV-IV in FIG. 2 and a part of the configuration is omitted, as described later. The display panel 10 includes a substrate 20 formed of glass or the like, and a drive transistor DRT formed on the substrate 20. The drive transistor DRT is made up of a channel formed of a semiconductor layer on the substrate 20, a gate electrode formed, spaced apart by a first insulating layer 21, and a source electrode and a drain electrode formed, spaced apart by a second insulating layer 22. The plurality of layers where the drive transistor DRT is formed, that is, the substrate 20, the first insulating layer 21, and the second insulating layer 22, are called a TFT layer.

A flattening resin layer 23 is formed in such a way as to cover the TFT layer. The flattening resin layer 23 includes a display area A where a plurality of lower electrodes 30 is formed and a peripheral area E surrounding the display area A, and has a band-like groove 40 which divides the part surrounding the display area A. The flattening resin layer 23 is formed in the display area A and the peripheral area E but is not formed in the first band area B or the second band area C. The plurality of lower electrodes 30 may be formed of a metal on the flattening resin layer 23. Also, a pixel separation film 32 is formed in such a way as to cover the ends of the plurality of lower electrodes 30. The pixel separation film 32 is also formed in the peripheral area E but is not formed in the first band area B or the second band area C. In the contact area D, the pixel separation film 32 is partially formed.

Moreover, an organic electroluminescence layer 33 including a light emitting layer is formed in the display area A and the peripheral area E in such a way as to be placed on the plurality of lower electrodes 30. The organic electroluminescence layer 33 according to this embodiment divides the inside and outside of the groove 40. However, a first island part 33a is left on a bottom surface 40a of the groove. In other words, the organic electroluminescence layer 33 is partly eliminated on the bottom surface 40a of the groove formed in the first band area B, and in the first band area B, the eliminated part continuously surrounds the display area A. The organic electroluminescence layer 33 is not formed in the second band area C. The organic electroluminescence layer 33 is partly eliminated in the contact area D as well, and a common electrode 31 formed on the flattening resin layer 23 is partly exposed.

On the organic electroluminescence layer 33, an upper electrode 34 is formed of a transparent conductive material such as ITO (indium tin oxide) or IZO (indium zinc oxide). The upper electrode 34 is formed in the display area A and in the peripheral area E excluding the second band area C. On the upper electrode 34, a sealing layer 35 is formed in such a way as to cover the organic electroluminescence layer 33. The sealing layer 35 is formed in the entire surfaces of the display area A and the peripheral area E and thus protects the organic electroluminescence layer 33 and the like. Although a color filter and a counter substrate are provided on the top side of the display panel 10, these components are not illustrated in FIG. 4.

Figure 5:
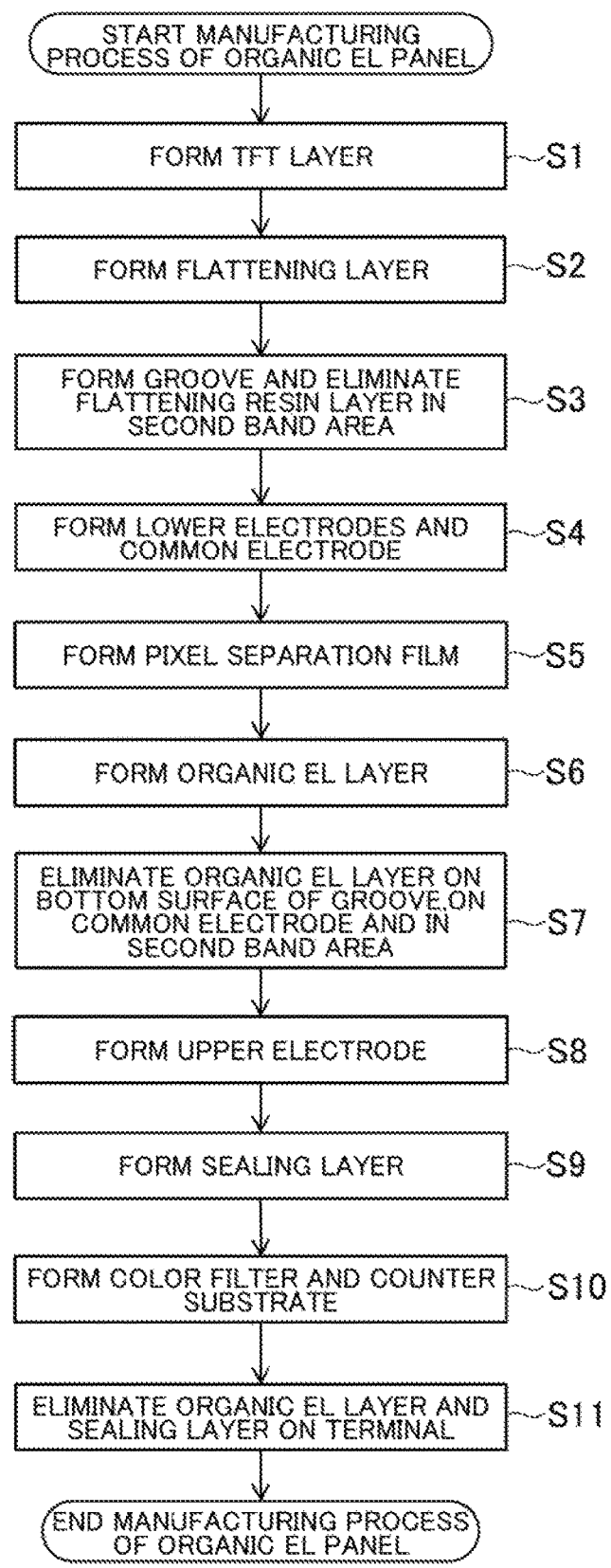
FIG. 5 is a flowchart showing the manufacturing process of the display panel according to the embodiment of the invention.

FIG. 5 is a flowchart showing the manufacturing process of the display panel 10 according to the embodiment of the invention. FIGS. 6A to 6E are first to fifth top views showing the manufacturing process of the display panel according to the embodiment of the invention. First, the TFT layer, which is a layer formed on the substraue 20 and includes the drive transistor DRT or the like, is formed (S1). The flattening resin layer 23 is formed on the TFT layer (S2). Then, the process of forming the band-like groove 40 dividing the flattening resin layer 23 in the form of surrounding the display area A, in the first band area B in the flattening resin layer 23 inciuding the display area A and the peripheral area E, is carried out (S3). In the process of forming the groove 40, the flattening resin layer 23 formed in the second band area C is eliminated as well (S3).

Subsequently, the plurality of lower electrodes 30 is formed in the display area A, and the common electrode 31 is formed in the contact area D (S4). Moreover, the pixel separation film 32 is formed in such a way as to cover the ends of the plurality of lower electrode 30 (S5). The pixel separation film 32 may also be formed in the peripheral area E. However, the pixel separation film 32 is formed, avoiding a part of the first band area B, the second band area C, and the contact area D. Alternatively, after the pixel separation film 32 is formed in the entire peripheral area E, the pixel separation film 32 may be eliminated from a part of the first band area B, the second band area C, and the contact area D.

Next, the process of forming the organic electroluminescence layer 33 including the light emitting layer on the flattening resin layer 23 and inside the groove 40 in such a way as to be placed on the plurality of lower electrodes 30 is carried out (36). Here, the organic electroluminescence layer 33 may be formed on the entire surfaces of the display area A and the peripheral area E. As the organic electroluminescence layer 33 is formed on the entire surfaces of the display area A and the peripheral area E, the organic electroluminescence layer 33 no longer needs to be patterned using a mask or the like, and therefore there is no risk of contaminating the organic electroluminescence layer 33. Thus, high quality of the display panel 10 can be maintained.

In the process of forming the organic electroluminescence layer 33, the organic electroluminescence layer 33 is formed on the common electrode 31, which is formed in the peripheral area E and supplies power to the upper electrode 34. A part of the common electrode 31 is exposed from the pixel separation film 32, and the organic electroluminescence layer 33 is formed on this exposed part.

Also, in the process of forming the organic electroluminescence layer 33, the organic electroluminescence layer 33 is formed on the terminal 11 provided in the peripheral area E. The terminal 11 is a terminal electrically connected to an external device, as shown in FIG. 2.

Figure 6A:
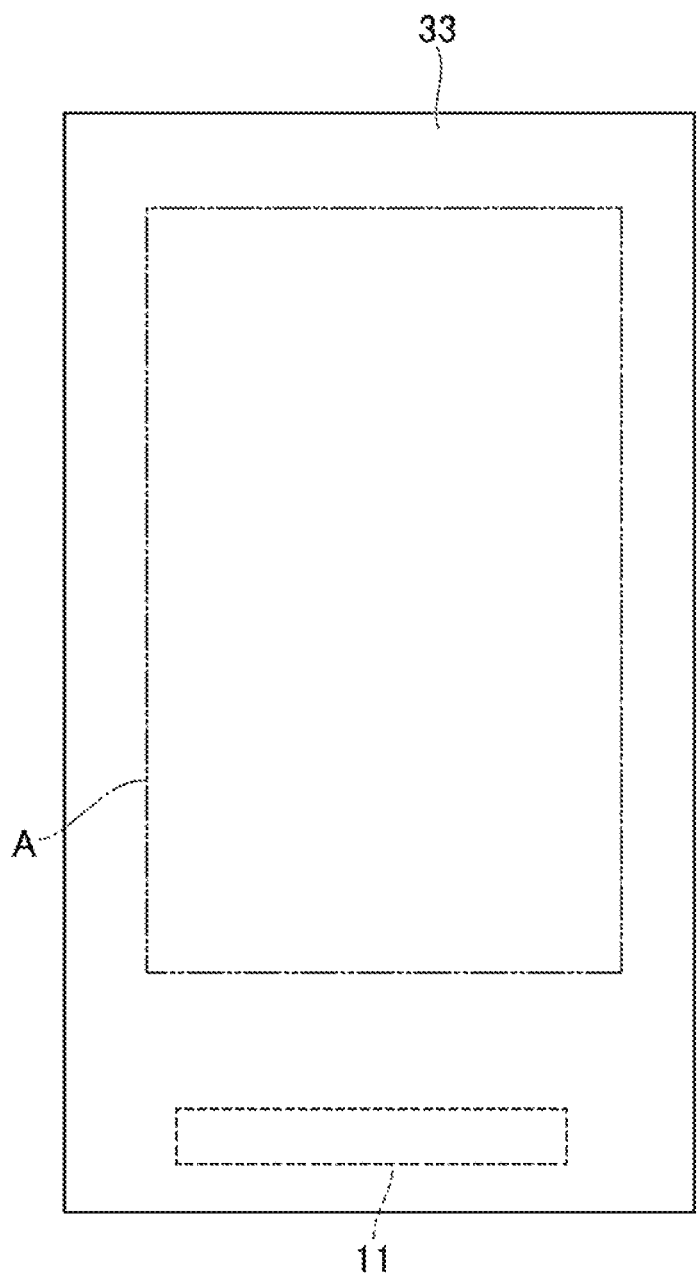
FIG. 6A is a first top view showing the manufacturing process of the display panel according to the embodiment of the invention.

FIG. 6A is a first top view showing the manufacturing process of the display panel according to the embodiment of the invention. FIG. 6A shows the display panel at the stage where the process of forming the organic electroluminescence layer 33 (S6) is finished. In this embodiment, the organic electroluminescence layer 33 is formed on the entire surfaces of the display area A and the peripheral area E and covers the terminal 11.

After the organic electroluminescence layer 33 is formed, the process of irradiating the orgsnic electroluminescence layer 33 with a pulse laser and thus eliminating the organic electroluminescence layer 33 is carried out in such a way that a part of the organic electroluminescence layer 33 is left in the shape of an island at least on the bottom surface 40a of the groove and that the bottom surface 40a of the groove is continuously exposed in the form of surrounding the display area A (S7). As described in detail with reference to FIG. 1, this process divides the organic electroluminescence layer 33, leaving the first island part 33a on the bottom surface 40a of the groove.

In the process of eliminating the organic electroluminescence layer 33, the organic electroluminescence layer 33 on the common electrode 31 is eliminated as well, thus exposing the common electrode 31. Also, in the process of eliminating the organic electroluminescence layer 33, the organic electroluminescence layer 33 in the second band area C surrounding the groove 40 is eliminated, thus exposing the second insulating layer 22. The elimination of the organic electroluminescence layer 33 formed on the common electrode 31 and the elimination of the organic electroluminescence layer 33 formed in the second band area C are carried out by irradiation with a pulse laser, as in the elimination of the organic electroluminescence layer 33 formed on the bottom surface 40a of the groove. However, a line laser may also be used, and other types of laser may be used as well.

Figure 6B:
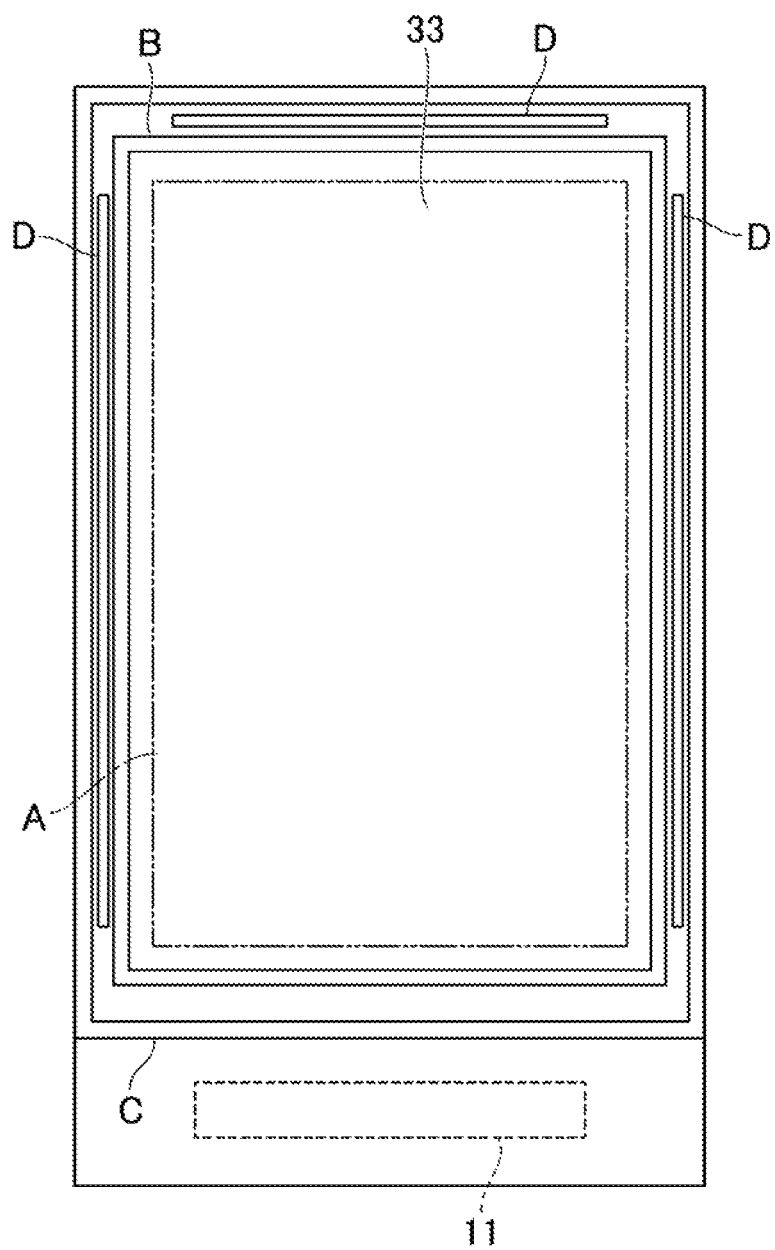
FIG. 6B is a second top view showing the manufacturing process of the display panel according to the embodiment of the invention.

FIG. 6B is a second top view showing the manufacturing process of the display panel according to the embodiment of the invention. FIG. 6B shows the display panel at the stage where the process of eliminating the organic electroluminescenoe layer 33 on the bottom surface 40a of the groove, on the common electrode 31 and in the second band area C (S7) is finished. The organic electroluminescence layer 33 is eliminated in the first band area B, where the groove 40 is formed, the seond band area C, where a sealant is provided, and the contact area D, where the common electrode 31 is exposed.

Subsequently, the process of forming the upper electrode 34 on the organic electroluminescence layer 33 is carried out (S8). The upper electrode 34 is formed continuously across the display area A and the peripheral area E excluding the second band area C. In the process of forming the upper electrode 34, the upper electrode 34 is formed in such a way as to boe placed on the common electrode 31. Thus, the upper electrode 34 and the common electrode 31 are electrically connected together, and a common potential (earth potential) is supplied to the upper electrode 34. Also, in the process of forming the upper electrode 34, the upper electrode 34 is formed in the area avoiding the second band area C and surrounded by the second band area C, of the peripheral area E. Thus, the formation of the upper electrode 34 in the second band area C is avoided, enabling secure sealing in the subsequent process.

Figure 6C:
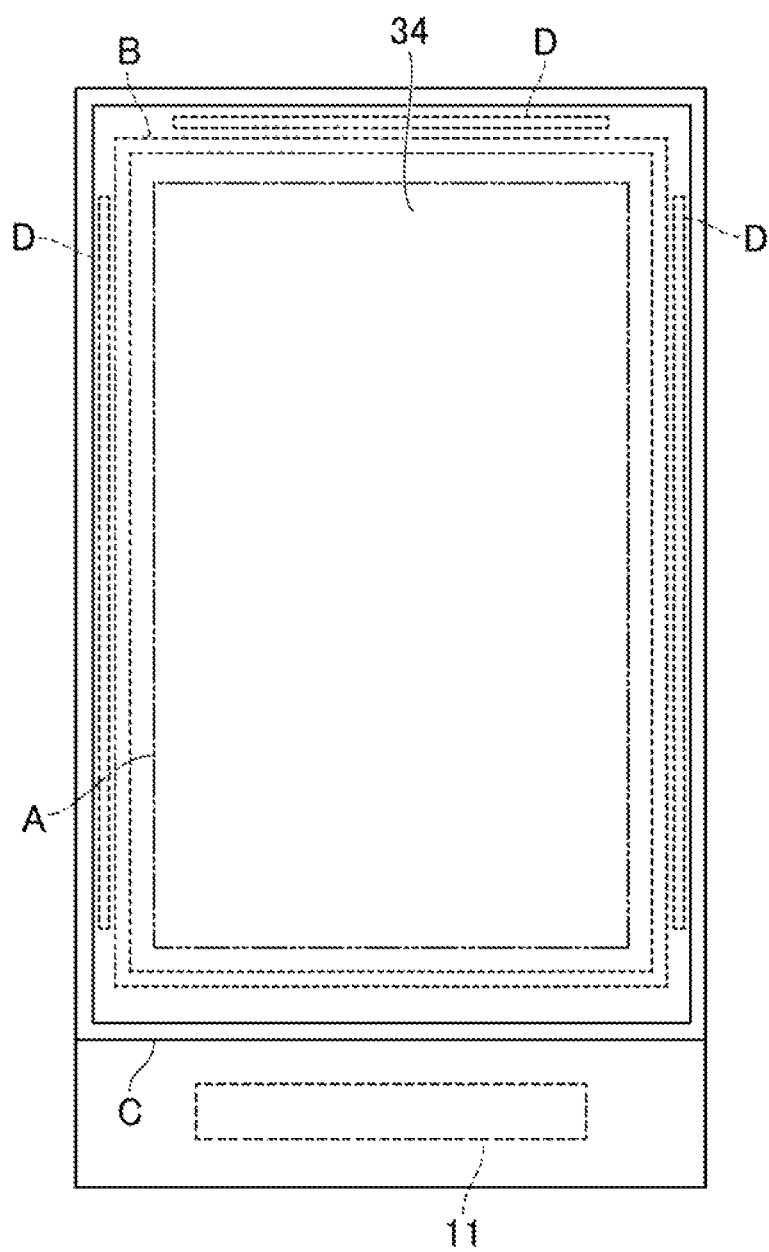
FIG. 6C is a third top view showing the manufacturing process of the display panel according to the embodiment of the invention.

FIG. 6C is a third top view showing the manufacturing process of the display panel according to the embodiment of the invention. FIG. 6C shows the display panel at the stage where the process of forming the upper electrode 34 (S8) is finished. The upper electrode 34 is formed in the form of being superimposed on the organic elcctroluminescence layer 33 and is formed on the entire surfaces of the display area A and the peripheral area E excluding the second band area C.

Next, the process of forming the sealing layer 35 in such a way as to cover the organic electroluminescence layer 33 is carried out (S9). The sealing layer 35 is formed on the entire surfaces of the display area A and the peripheral area E. In the process of forming the sealing layer 35, the sealing layer 35 is formed in such a way as to be placed on the surface of the second band area C, where the organic electroluminescence layer 33 is eliminated. Thus, the entry of the outside air and moisture from the peripheral area E is prevented.

In the process of forming the sealing layer 35, the sealing layer 35 is formed on the entire surface of the display panel 10 and is formed in such a way as to cover the terminal 11. Thus, the organic electroluminescence layer 33 and the like can be completely sealed.

Figure 6D:
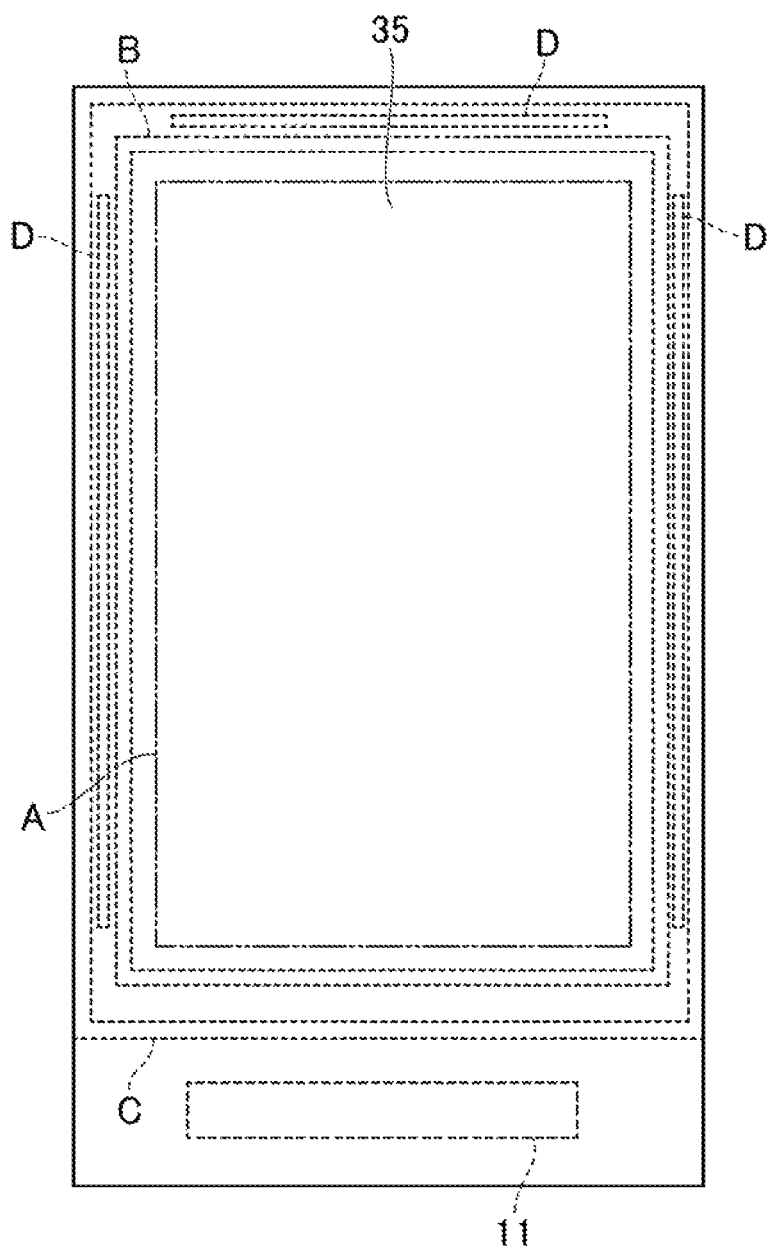
FIG. 6D is a fourth top view showing the manufacturing process of the display panel according to the embodiment of the invention.

FIG. 6D is a fourth top view showing the manufacturing process of the display panel according to the embodiment of the invention. FIG. 6D shows the display panel at the stage where the process of forming the sealing layer 35 (S9) is finished. The sealing layer 35 is formed on the entire surfaces of the display area A and the peripheral area E and is also formed in the second band area C.

Moreover, a color filter and a counter substrate 36 are formed on the sealing layer 35 (S10). Here, the counter substrate 36 is bonded to the sealing layer 35 by the sealant provided in the second band area C. The counter substrate 36 is formed in such a way as to cover the display area A and the peripheral area E, but is not formed on the terminal 11. Also, in this process, a filler may be provided between the counter substrate 36 and the sealing layer 33 in the area inside the second band area C.

After the process of forming the color filter and the counter substiave 36 carried out following the process of forming the sealing layer 35, the process of eliminating, by etching, the organic electroluminescence layer 33 and the sealing layer 35 formed on the terminal 11 is carried out (S11). This process is carried out by etching using the counter substrate 36 as a mask. Since the counter substrate 36 is used as a mask, a mask forming process and a mask elimination process can be omitted and the manufacturing process can be shortened.

Figure 6E:
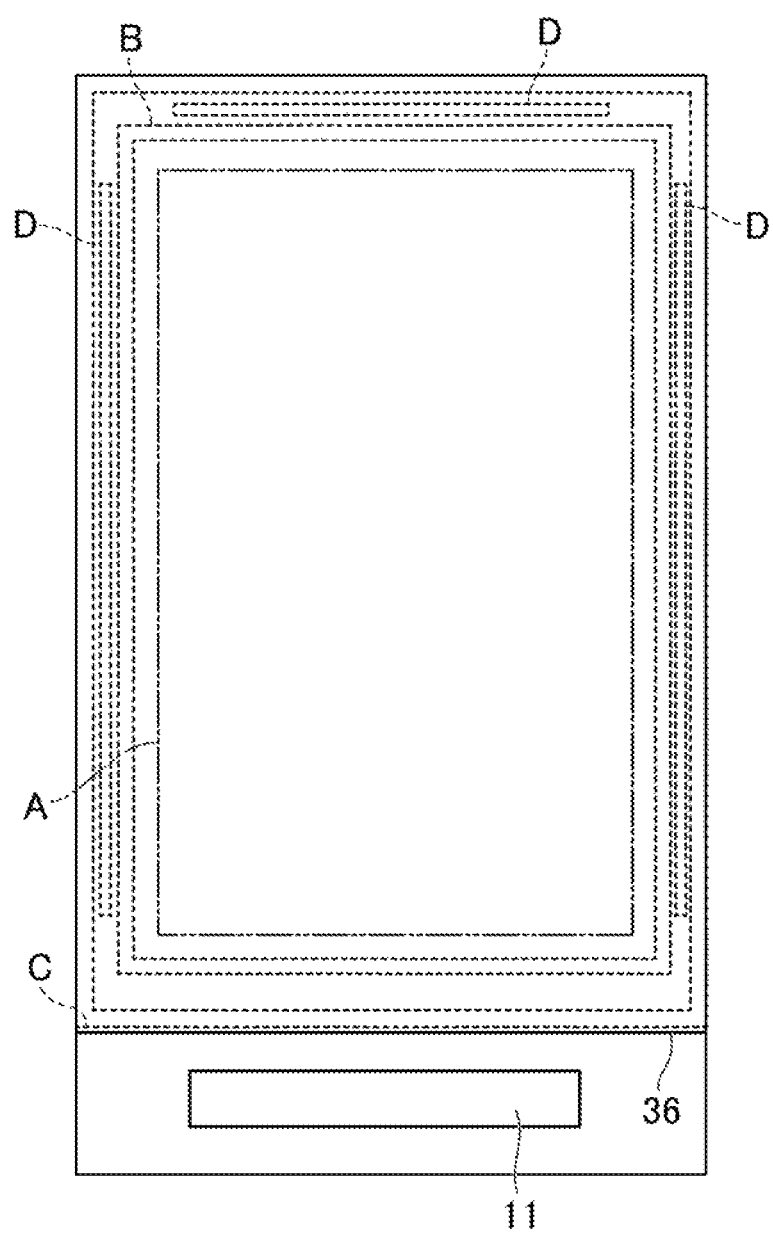
FIG. 6E is a fifth top view showing the manufacturing process of the display panel according to the embodiment of the invention.

FIG. 6E is a fifth top view showing the manufacturing process of the display panel according to the embodiment of the invention. FIG. 6E shows the display panel at the stage where the process of eliminating, by etching, the organic electroluminescence layer 33 and the sealing layer 35 formed on the terminal 11 (S11) is finished. The counter substrate 36 is bonded by the sealant provided in the second band area C. The terminal 11 is exposed by the etching using the counter substrate 36 as a mask. With this, the manufacturing process of the display panel 10 according to this embodiment ends.

Figure 7:
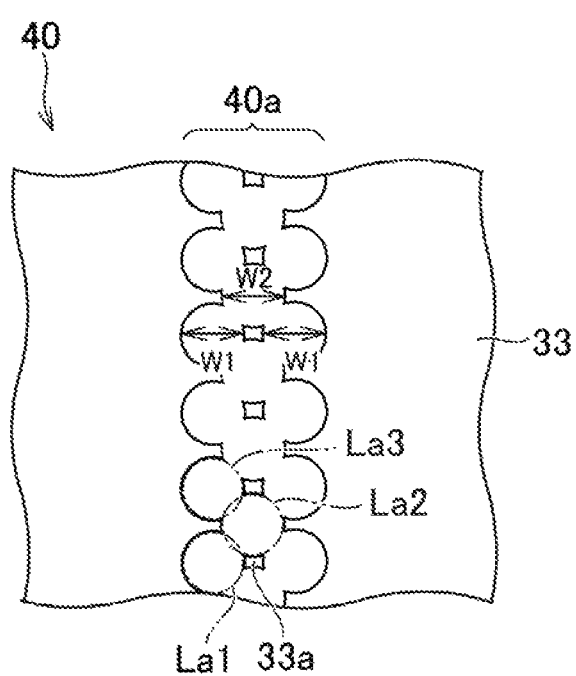
FIG. 7 is a top view of the bottom surface of a groove in the display panel according to the embodiment of the invention.

FIG. 7 is a top view of the bottom surface 40a of the groove in the display panel 10 according to the embodiment of the invention. FIG. 7 only shows the organic electroluminescence layer 33 in order to simplify the explanation. Although the organic electroluminescence layer 33 is eliminated from the bottom surface 40a of the groove, the first island part 33a is left there. The groove 40 is provided in the shape of a band surrounding the display area A, and the organic electroluminescence layer 33 is continuously eliminated from the bottom-surface 40a of the groove. Therefore, the organic electroluminescence layer 33 is divided into the part formed the inside of the groove 40 and the part formed on the outside of the groove 40, at the bottom surface 40a of the groove. Also, the organic electroluminescence layer 33 according to this embodiment is not entirely eliminated from the bottom surface 40a of the groove but is intermittently eliminated by irradiation with a pulse laser with a relatively large aperture, leaving the first island part 33a.

FIG. 7 shows a first spot La1, a second spot La2, and a third spot La3 of the pulse laser in a virtual manner. Here, the first spot La1 and the second spot La2 are cast in such a say as to overlap with each other, and the second spot La2 and the third spot La3 are cast in such a way as to overlap with each other as well. Thus, the organic electroluminescence layer 33 is continuously eliminated from the bottom surface 40a of the groove in such a way as to leave the first island part 33a. On the bottom surface 40a of the groove, the organic electroluminescence layer 33 is eliminated in a wave-shape as viewed in a plan view and has a shape in which multiple arc parts are formed overlapping with each other according to a predetermined rule. Also, the total elimination width (W1+W1) of the organic electroluminescence layer 33 measured in the direction of traversing the groove 40 at the site where the organic electroluminescence layer 33 is left in the shape of an island (site where the first island part 33a is provided) is broader than the elimination width (W2) of the organic electroluminescence layer 33 measured in the direction of traversing the groove 40 at the site where the organic electroluminescence layer 33 is not left in the shape of an island. That is, W2<2×W1 holds. Thus, the entry of moisture and the like is restrained even in the case where the organic electroluminescence layer 33 is left in the shape of an island.

In the display panel 10 according to this embodiment, moisture or the like is prevented from entering the display area A from the peripheral area E via the organic electroluminescence layer 33. Therefore, the display panel 10 is prevented from deteriorating and high display quality is maintained. Also, since the first island part 33a is left en the bottom surface 40a of the groove, the increase in the laser irradiation area is restrained even in the case where the organic electroluminescence layer 33 is eliminated by laser ablation. Therefore, the manufacturing time of the display panel 10 is shortened and the manufacturing cost is reduced.

Also, a part of the organic electroluminescence layer 33 may be eliminated, leaving the first island part 33a, in the contact area D as well. In this case, since the laser irradiation can be minimized while securing the electrical connection between the upper electrode 34 and the common electrode 31, the manufacturing time of the display panel 10 is shortened and the manufacturing cost is reduced.

Figure 8:
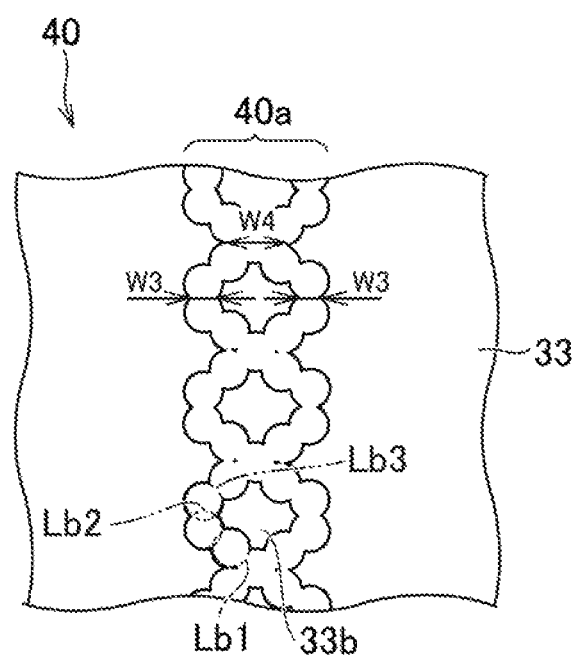
FIG. 8 is a top view of the bottom surface of a groove in a display panel according to a modification of the embodiment of the invention.

FIG. 8 is a top view of the bottom surface 40a of the groove in the display panel 10 according to a modification of the embodiment of the invention. The display panel 10 according to this modification is different from the display panel 10 according to the embodiment shown in FIGS. 6A to 6E only in the form of elimination of the organic electroluminescence layer 33 on the bottom surface 40a of the groove. In this modification, the organic electroluminescence layer 33 on the bottom surface 40a of the groove is irradiated with a pulse laser with a relatively small aperture, and the organic electroluminescence layer 33 is eliminated, shifting the irradiated position so that irradiation ranges are superimposed. Consequently, the organic electroluminescence layer 33 is not entirely eliminated from the bottom surface 40a of the groove, and a second island part 33b is left. In the case of this modification, too, the organic electroluminescence layer 33 is left in the shape of an island on the bottom surface 40a of the groove, and the bottom surface 40a of the groove is continuously exposed in the form of surrounding the display area A.

FIG. 8 shows a fourth spot Lb1, a fifth spot Lb2, and a sixth spot Lb3 of the pulse laser in a virrtual manner. Here, the fourth spot Lb1 and the fifth spot Lb2 are cast in such a way as to overlap with each other, and the fifth spot Lb2 and the sixth spot Lb3 are cast in such a way as to overlap with each other as well. Thus, the organic electroluminescence layer 33 is continuously eliminated from the bottom surface 40a of the groove in such a way as to leave the second island part 33b. On the bottom surface 40a of the groove, the organic electroluminescence layer 33 is eliminated in a wave-shape as viewed in a plan view and has a shape in which multiple arc parts are formed overlapping with each other according to a predetermined rule. Also, the total elimination width (w3+W3) of the organic electroluminescence layer 33 measured in the direction of traversing the groove 40 at the site where the organic electroluminescence layer 33 is left in the shape of an island (site where the second island part 33b is provided) is broader than the elimination width (W4) of the organic electroluminescence layer 33 measured in the direction of traversing the groove 40 at the site where the organic electroluminescence layer 33 is not left in the shape of an island. That is, W4<2×W3 holds. Thus, the entry of moisture and the like is restrained even in the case where the organic electroluminescence layer 33 is left in the shape of an island.

In the display panel 10 according to this modification, moisture or the like is similarly prevented from entering the display area A from the peripheral area E via the organic electroluminescence layer 33. Therefore, the display panel 10 is prevented from deteriorating and high display quality is maintained. Also, since the second island part 33b is left on the bottom surface 40a of the groove, the increase in the laser irradiation area is restrained even in the case where the organic electroluminescence layer 33 is eliminated by laser ablation. Therefore, the manufacturing time of the display panel 10 is shortened and the manufacturing cost is reduced.

Figure 9A:
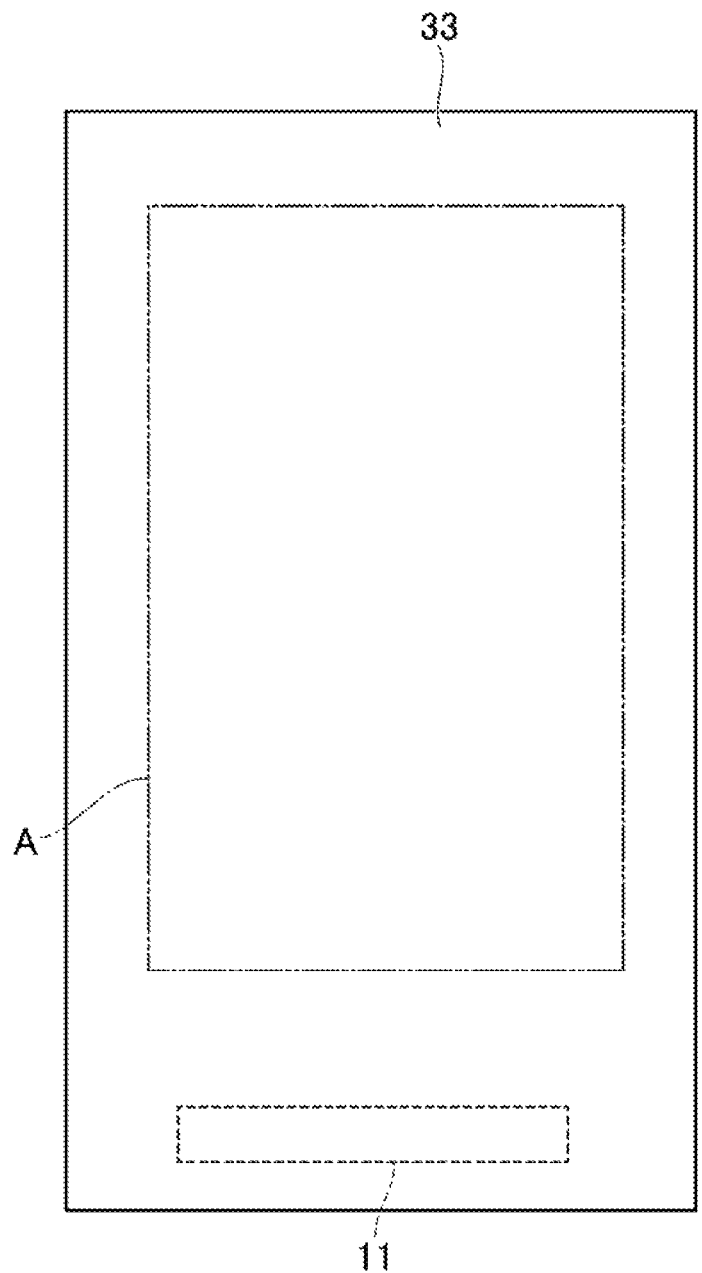
FIG. 9A is a first top view showing a first modification of the manufacturing process of the display panel according to the embodiment of the invention.

FIG. 9A is a first top view showing a first modification of the manufacturing process of the display panel according to the embodiment of the invention. FIG. 9A shows the display panel at the stage where the process of forming the organic electroluminescence layer 33 is finished. In this modification, the organic electroluminescence layer 33 is formed on the entire surfaces of the display area A and the peripheral area E and covers the terminal 11.

Figure 9B:
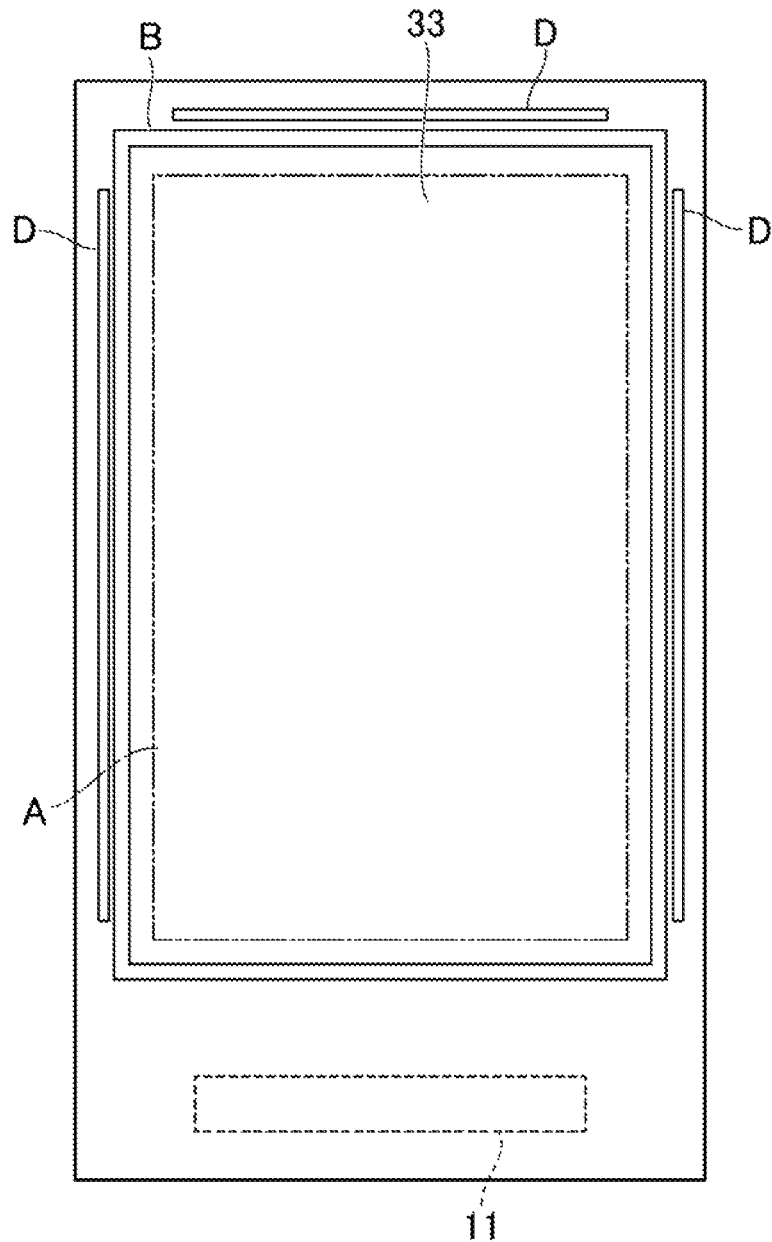
FIG. 9B is a second top view showing the first modification of the manufacturing process of the display panel according to the embodiment of the invention.

FIG. 9B is a second top view showing the first modification of the manufacturing process of the display panel according to the embodiment of the invention. In this modification, the organic electroluminescence layer 33 is eliminated on the bottom surface 40a of the groove and on the common electrode 31 and is not eliminated in the second band area C. FIG. 9B shows the display panel at the stage where the process of eliminating the organic electroluminescence layer 33 is finished. The organic electroluminescence layer 33 is eliminated in the first band area B, where the groove 40 is formed, and in the contact area D, where the common electrode 31 is exposed. In this modification, the organic electroluminescence layer 33 formed on the bottom surface 40a of the groove and on the common electrode 31 is eliminated by irradiation with a pulse laser. However, since the organic electroluminescence layer 33 formed in the second band area C is not eliminated, the laser irradiation area can be reduced further.

Figure 9C:
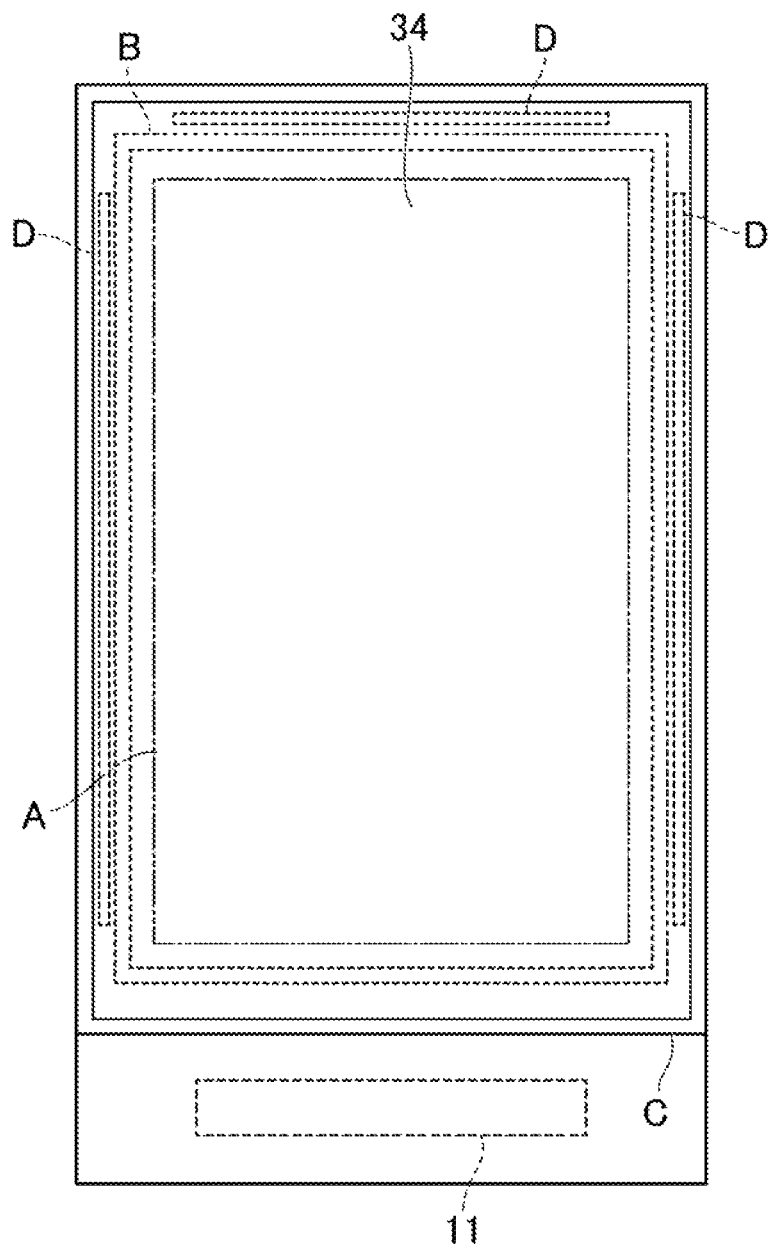
FIG. 9C is a third top view showing the first modification of the manufacturing process of the display panel according to the embodiment of the invention.

FIG. 9C is a third top view showing the first modification of the manufacturing process of the display panel according to the embodiment of the invention. FIG. 9C shows the display panel at the stage where the process of forming the upper electrode 34 is finished. The upper electrode 34 is formed on the entire surfaces of the display area A and the peripheral area E excluding the second band area C.

Figure 9D:
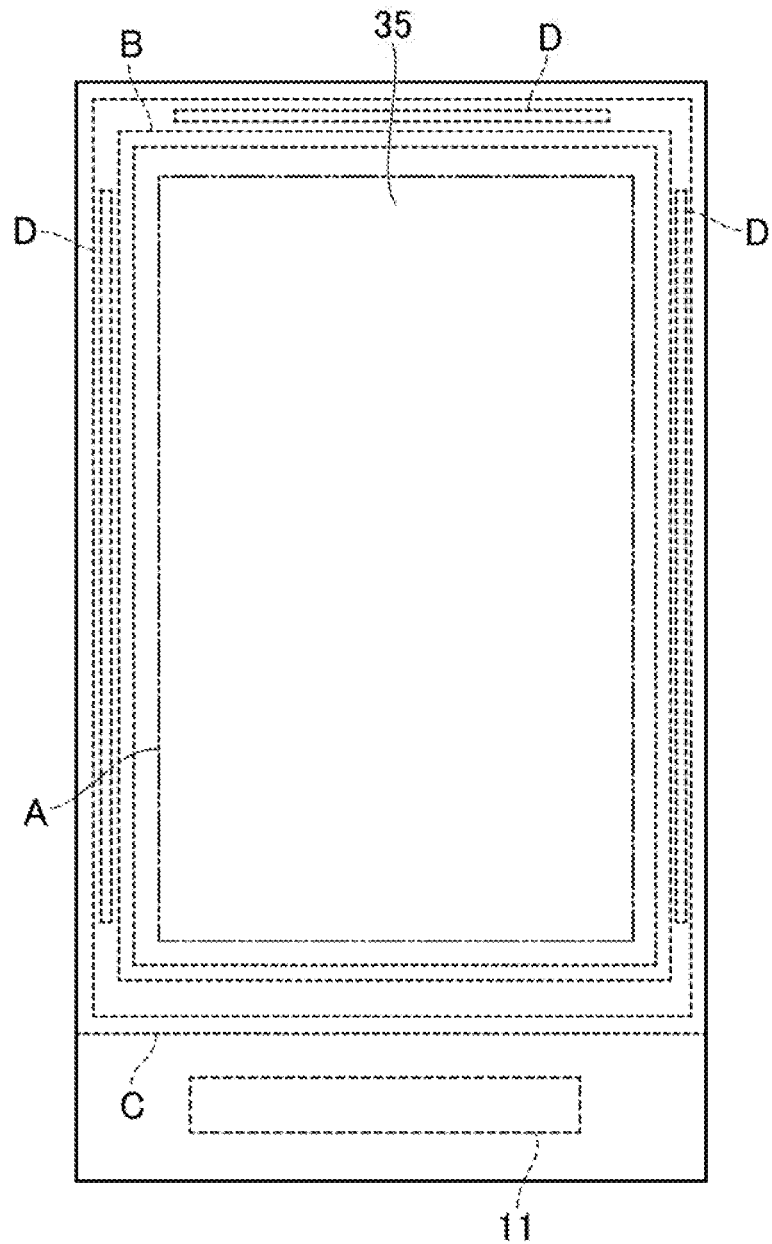
FIG. 9D is a fourth top view showing the first modification of the manufacturing process of the display panel according to the embodiment of the invention.

FIG. 9D is a fourth top view showing the first modification of the manufacturing process of the display panel according to the embodiment of the invention. FIG. 9D shows the display panel at the stage where the process of forming the sealing layer 35 is finished. The sealing layer 35 is formed on the entire surfaces of the display area A and the peripheral area E and is also formed in the second band area C.

Figure 9E:
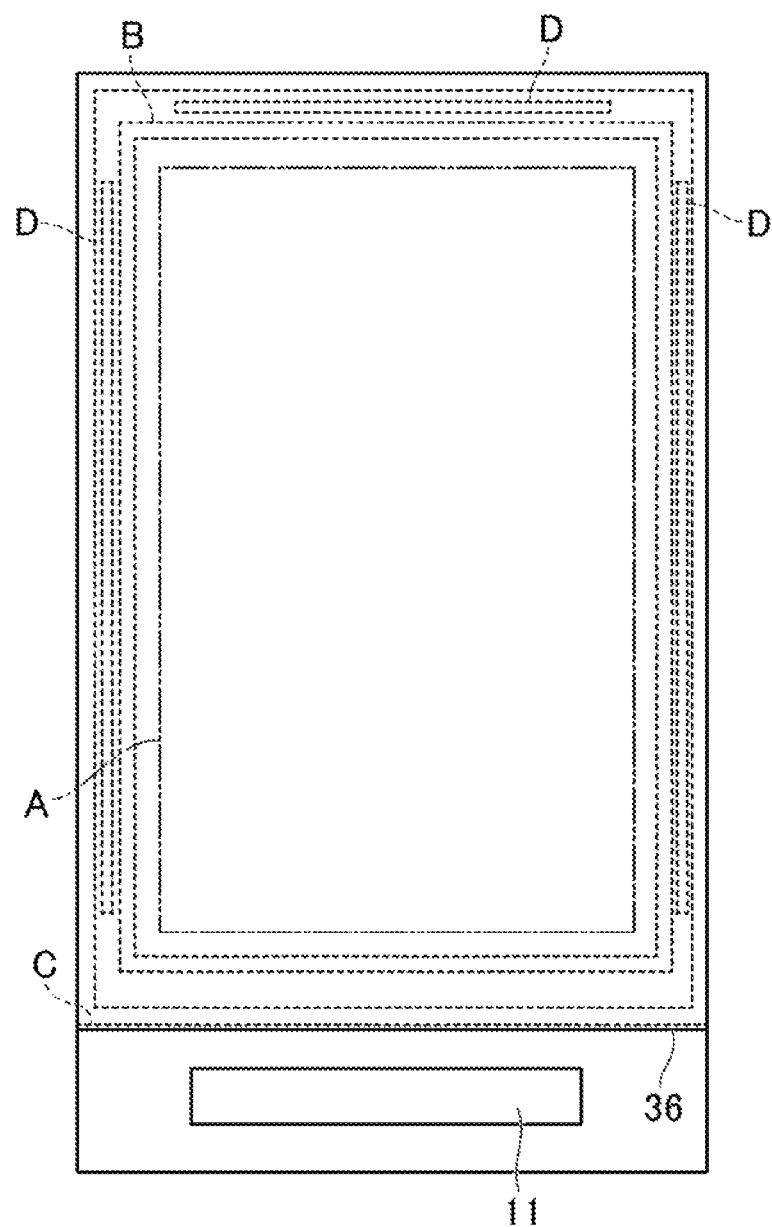
FIG. 9E is a fifth top view showing the first modification of the manufacturing process of the display panel according to the embodiment of the invention.

FIG. 9E is a fifth top view showing the first modification of the manufacturing process of the display panel according to the embodiment of the invention. FIG. 9E shows the display panel at the stage where the process of bonding the counter substrate 36 to the sealing layer 35 with the sealant provided in the second band area C is carried out and where the process of eliminating, by etching, the organic electroluminescence layer 33 and the sealing layer 35 formed on the terminal 11 is finished. The counter substrate 36 is bonded to the sealing layer 35 with the sealant provided in the second band area C. The terminal 11 is exposed by the etching using the counter substrate 36 as a mask.

Figure 10:
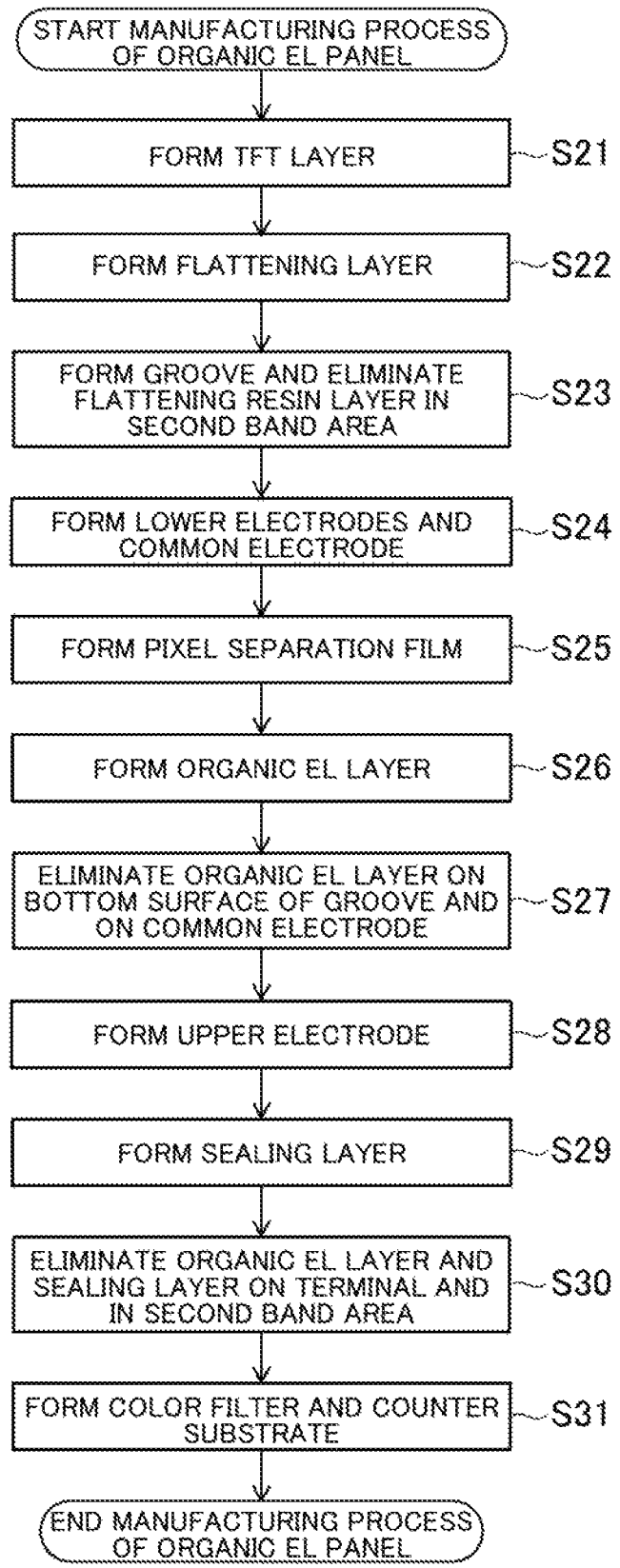
FIG. 10 is a flowchart showing a second modification of the manufacturing process of the display panel according to the embodiment of the invention.

FIG. 10 is a flowchart showing a second modification of the manufacturing process of the display panel 10 according to the embodiment of the invention. FIGS. 11A to 11F are first to sixth top views showing the second modification of the manufacturing process of the display panel according to the embodiment of the invention. The manufacturing process according to this modification is similar to the manufacturing process shown in FIG. 5, up to the process of forming the organic electroluminescence layer 33. That is, the TFT layer is formed first (S21) and the flattening resin layer 23 is formed (S22). Then, the groove 40 is formed in the first band area B and the flattening resin layer 23 in the second band area C is eliminated (S23). The lower electrodes 30 in the display area A and the common electrode 31 in the contact area D are formed (S24). Moreover, the pixel separation film 32 is formed (S25) and the organic electroluminescence layer 33 is formed in tne dlspray area A and the peripheral area E excluding the second band area C (S26).

Figure 11A:
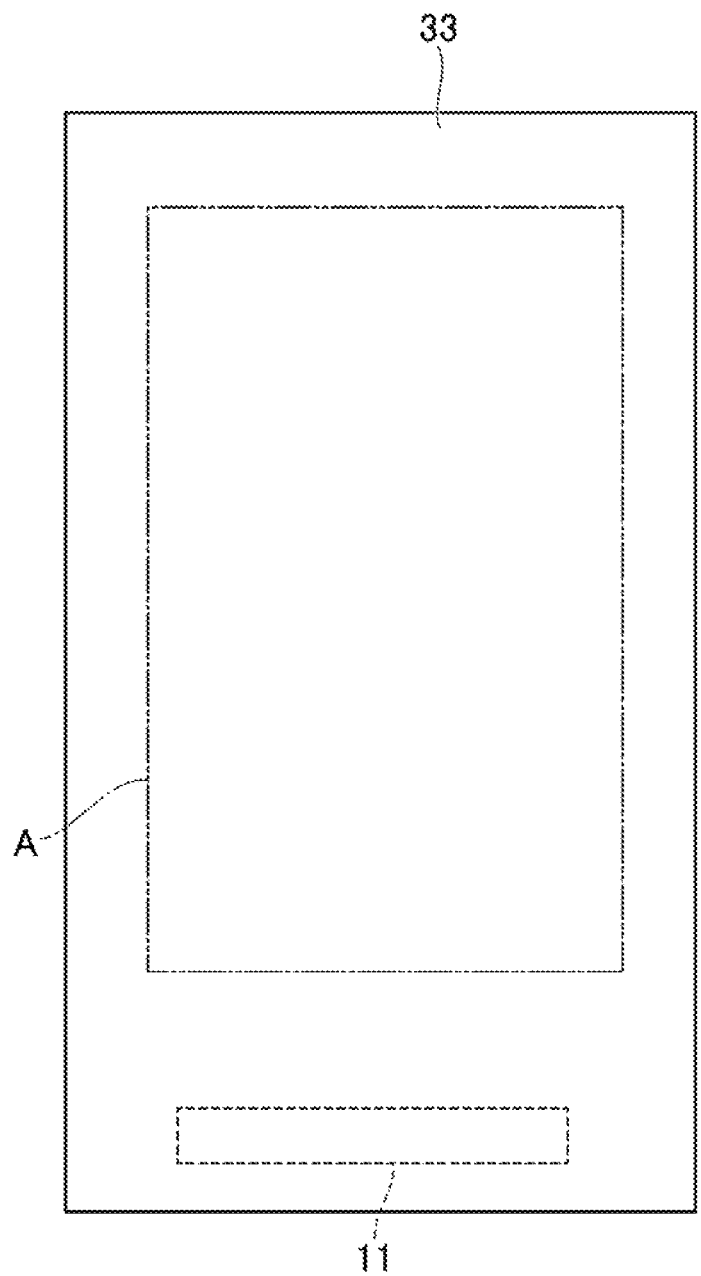
FIG. 11A is a first top view showing the second modification of the manufacturing process of the display panel according to the embodiment of the invention.

FIG. 11A is a first top view showing the second modification of the manufacturing process of the display panel according to the embodiment of the invention. FIG. 11A shows the display panel at the stage where the process of forming the organic electroluminescence layer 33 (S26) is finished. In this modification, the organic electroluminescence layer 33 is formed on the entire surfaces of the display area A and the peripheral area E and covers the terminal 11.

Next, the organic electroluminescence layer 33 formed on the bottom surface 40a of the groove and on the common electrode 31 is eliminated (S27). The elimination of the organic electroluminescence layer 33 is carried out using a pulse laser, and the organic electroluminescence layer 33 is left in the shape of an island. The shape of the orgnaic electroluminescence layer 33 left in the shpae of an island may be similar to the shape of the first island part 33a shown an FIG. 7 or similar to the shape of the second island part 33b shown in FIG. 8, or may be other shapes. Here, this modification is different from the manufacturing process shown in FIG. 5 in that the organic electroluminescence layer 33 formed in the second band area C is not eliminated.

Figure 11B:
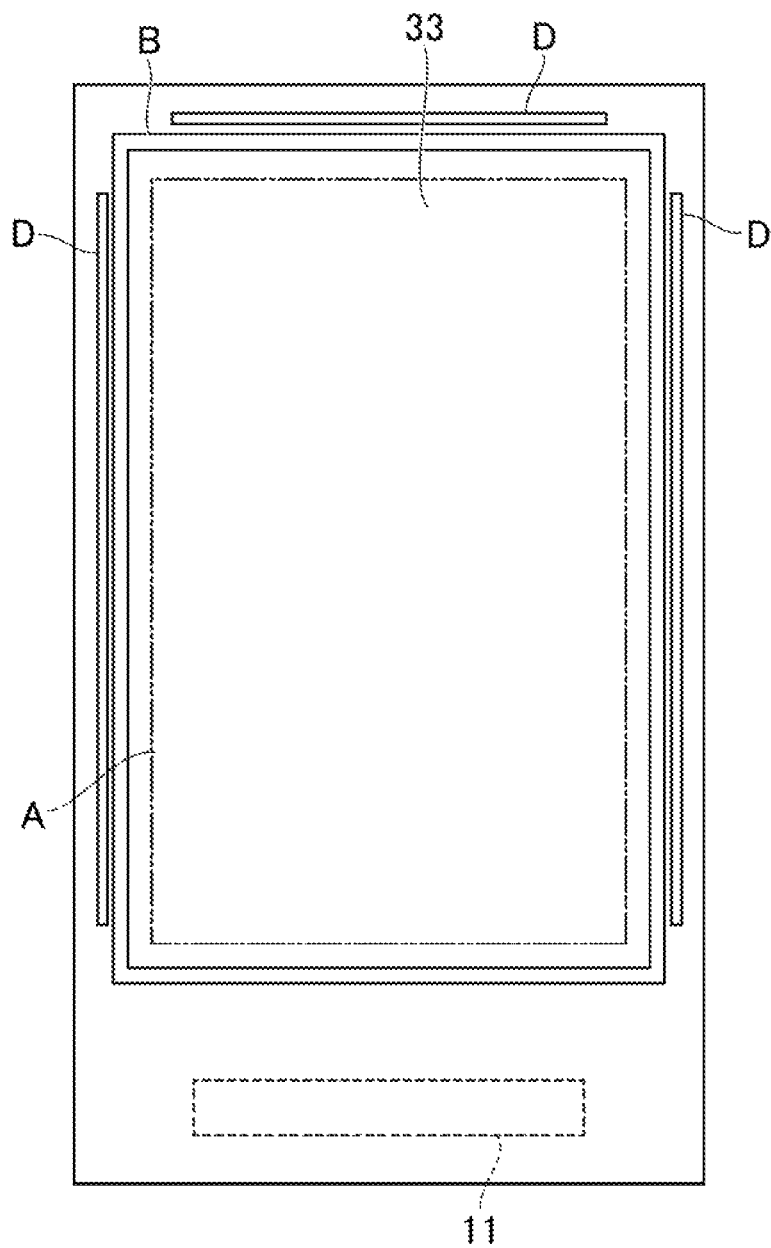
FIG. 11B is a second top view showing the second modification of the manufacturing process of the display panel according to the embodiment of the invention.

FIG. 11B is a second top view showing the second modification of the manufacturing process of the display panel according to the embodiment of the invention. FIG. 11B shows the display panel at the stage where the process of eliminating the organic electroluminescence layer 33 on the bottom surface 40a of the groove and on the common electrode 31 (327) is finished. The organic electroluminescence layer 33 is eliminated in the first band area B, where the groove 40 is formed, and in the contact area D, where the common electrode 31 is exposed.

Subsequently, the upper electrode 34 is formed in the display area A and the peripheral area E excluding the second band area C (S28). Then, the sealing layer 35 is formed on the entire surface of the display panel 10 (S29).

Figure 11C:
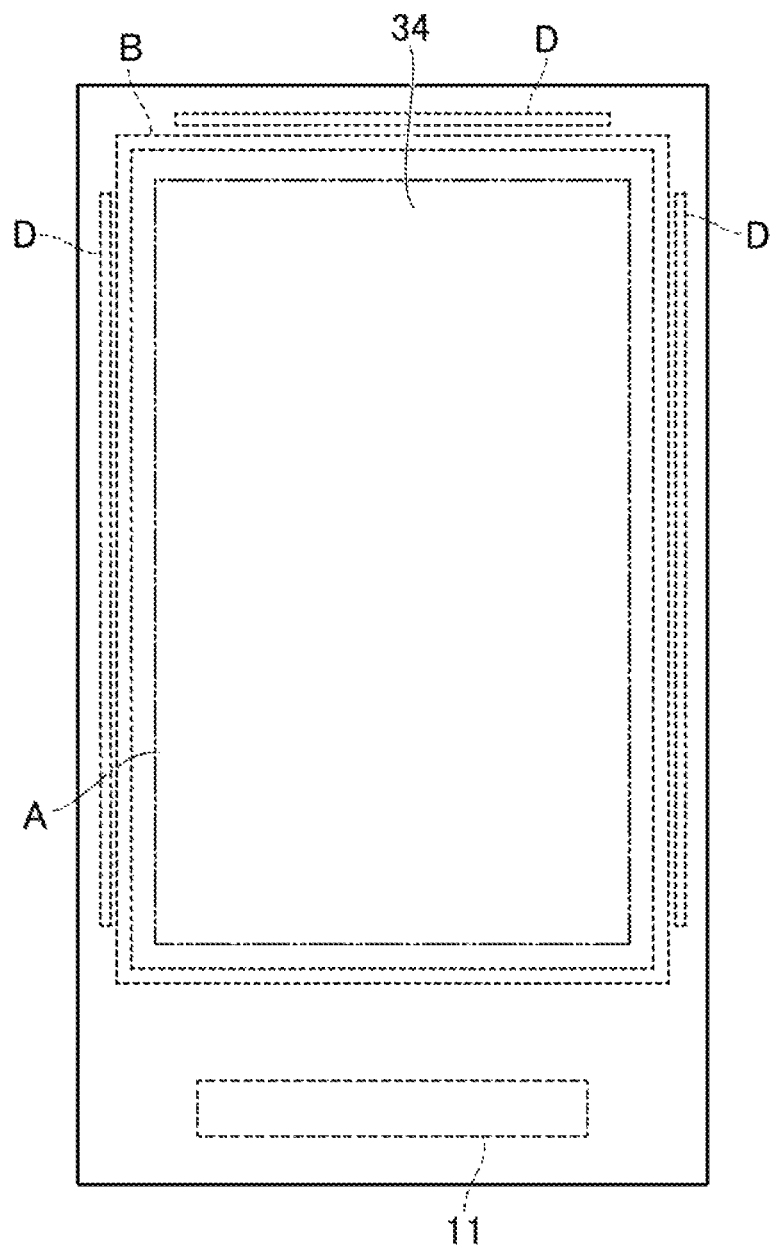
FIG. 11C is a third top view showing the second modification of the manufacturing process of the display panel according to the embodiment of the invention.

FIG. 11C is a third top view showing the second modification of the manufacturing process of the display panel according to the embodiment of the invention. FIG. 11C shows the display panel at the stage where the process of forming the upper electrode 34 (S28) is finished. The upper electrode 34 is formed in the form of being superimposed on the organic electroluminescence layer 33 and is formed on the entire surfaces of the display area A and the peripheral area E.

Figure 11D:
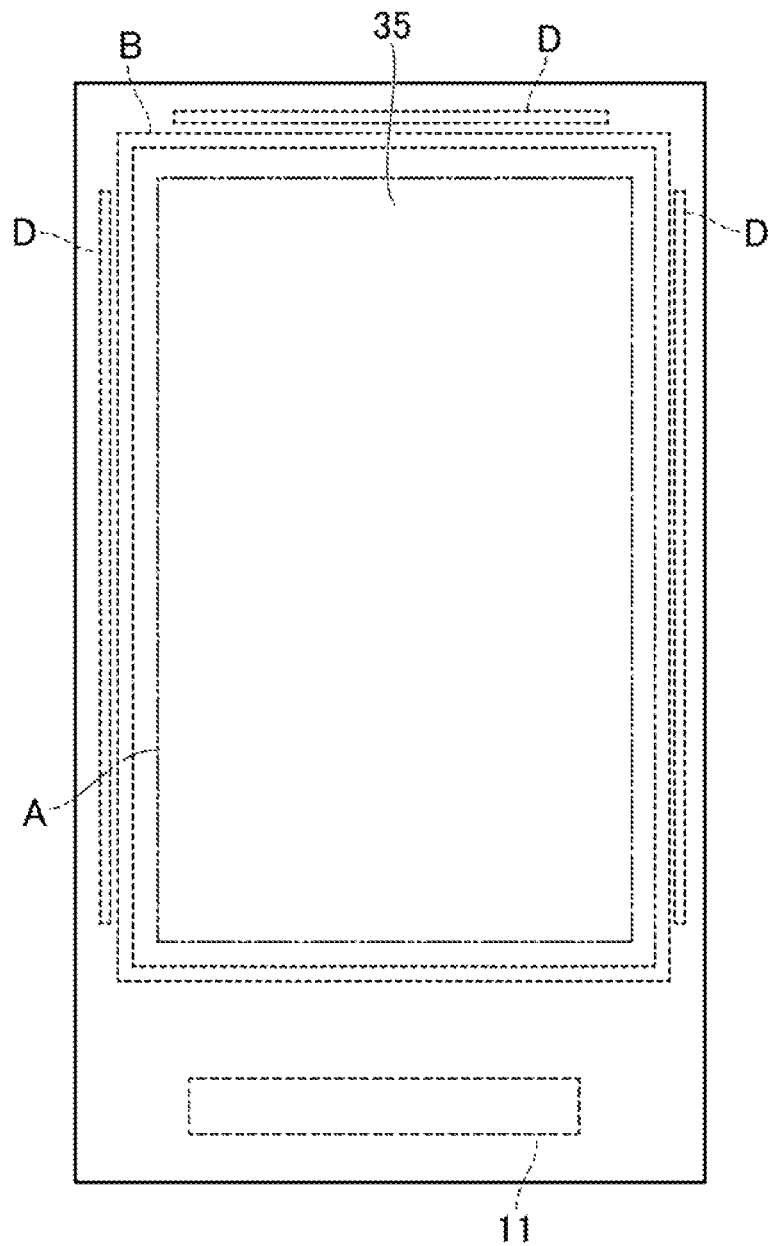
FIG. 11D is a fourth top view showing the second modification of the manufacturing process of the display panel according to the embodiment of the invention.

FIG. 11D is a fourth top view showing the second modification of the manufacturing process of the display panel according to the embodiment of the invention. FIG. 11D shows the display panel at the stage where the process of forming the sealing layer 35 (S29) is finished. The sealing layer 33 is formed on the entire surfaces of the displey area A and the peripheral area E.

After the sealing layer 35 is formed, the organic electroluminescence layer 33 and the sealing layer 35 formed on the terminal 11 and in the second band area C are eliminated by a laser (S30). Thus, the terminal 11 and the sceond insulating layer 22 in the second band area C are exposed. In this modification, the elimination of the organic electroluminescence layer 33 and the sealing layer 35 is carried out using a line laser. As a line laser is used, a broad area can be irradiated with the laser, and the terminal 11 and the second insulating layer 22 in the second band area C can be exposed efficiently in a short time. Also, the elimination of the organic electroluminescence layer 33 and the sealing layer 35 can be carried out using other types of lasers than the line laser.

Figure 11E:
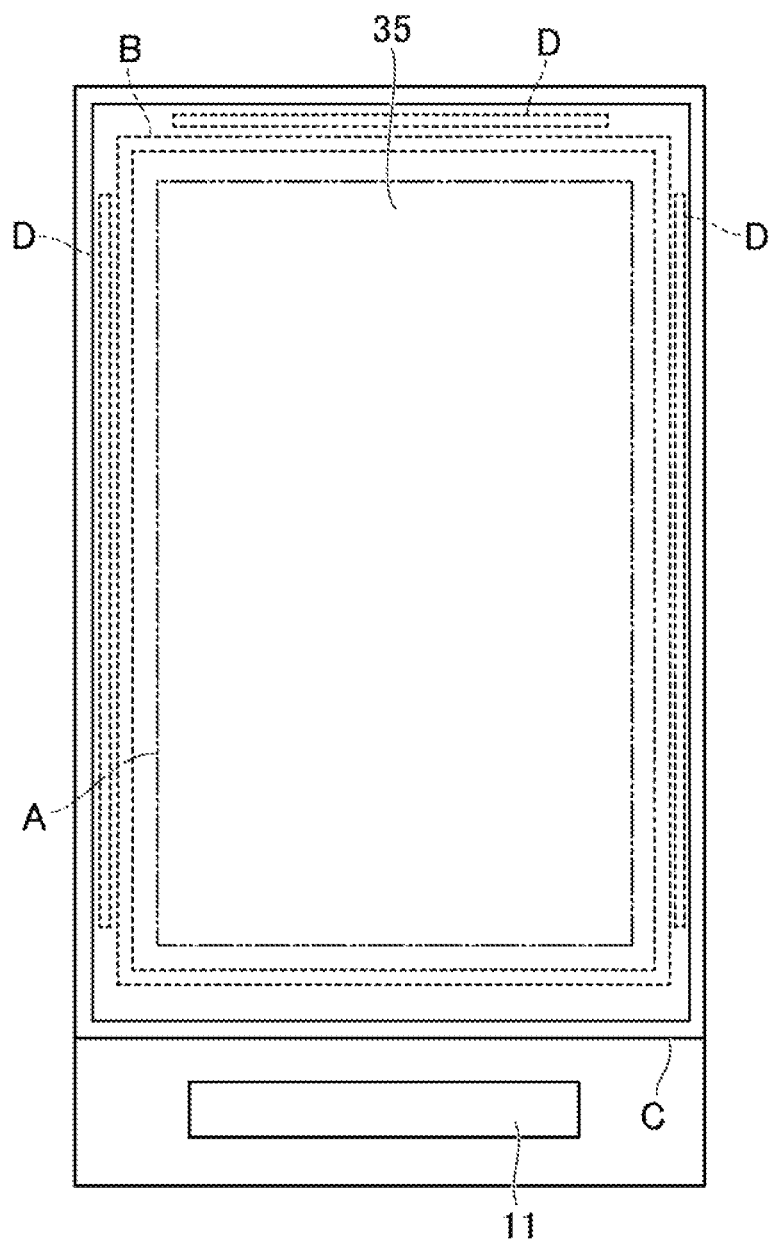
FIG. 11E is a fifth top view showing the second modification of the manufacturing process of the display panel according to the embodiment of the invention.

FIG. 11E is a fifth top view showing the second modification of the manufacturing process of the display panel according to the embodiment of the invention. FIG. 11E shows the display panel at the stage where the process of eliminating, by a line laser, the organic electroluminescence layer 33 and the sealing layer 35 formed on the terminal 11 and in the second band area C (S30) is finished. As the result of eliminating the organic electroluminescence layer 33 and the sealing layer 35 by laser ablation, the second insulating layer 22 in the second band area C and the terminal 11 are exposed.

Finally, the color filter and the counter substrate are formed (S31). The counter substrate 36 is bonded, with the sealant, to the second insulating layer 22 in the second band area C exposed in the previous process. With this, the manufacturing process of the display panel 10 according to this modification ends.

Figure 11F:
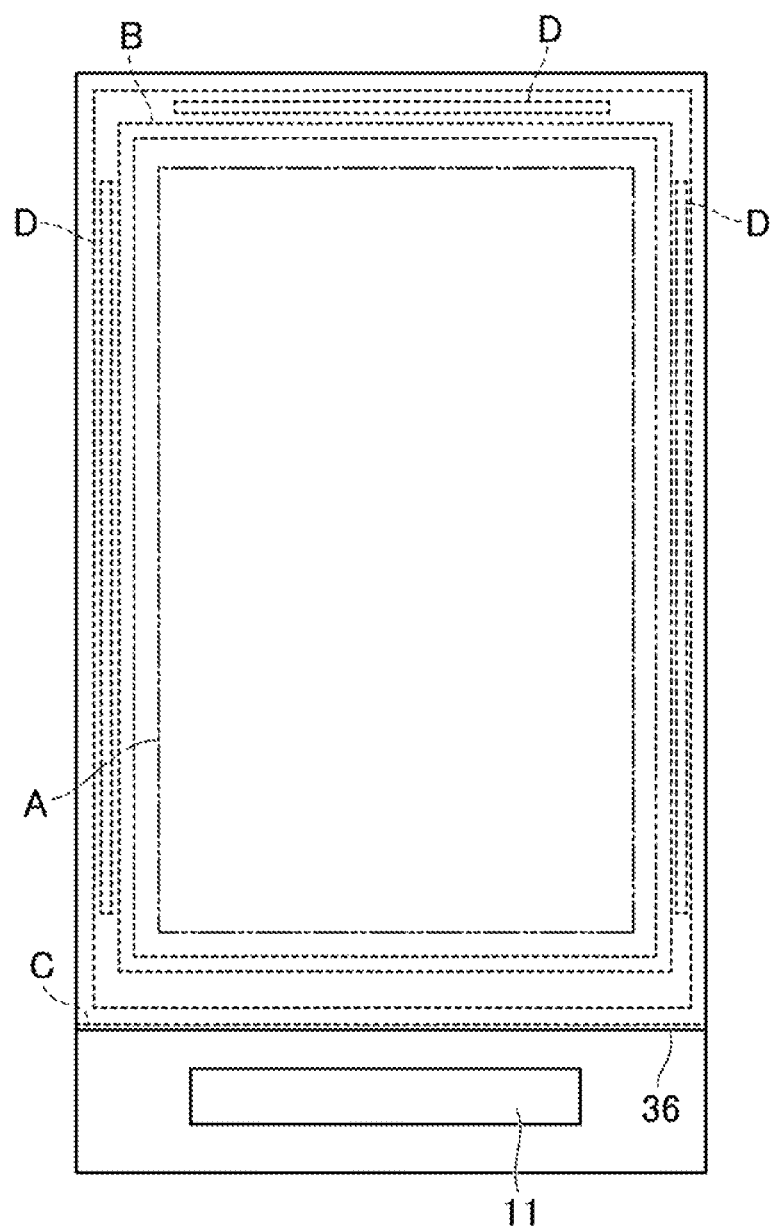
FIG. 11F is a sixth top view showing the second modification of the manufacturing process of the display panel according to the embodiment of the invention.

FIG. 11F is a sixth top view showing the second modification of the manufacturing process of the display panel according to the embodiment of the invention. FIG. 11F shows the display panel at the stage where the process of forming the color filter and the counter substrate 36 (S31) is finished. The counter substrate 36 is bonded to the second insulating layer 22 in the second band area C, and the terminal 11 is exposed.

All display devices that can be implemented by a person skilled in the art by suitably changing designs based on the display device 1 described above as an embodiment of the invention are within the scope of the invention as long as these display devices include the spirit of the invention. For example, the organic electroluminescence layer 33 left on the bottom surface 40a of the groove may have various different shapes in addition to shapes like the first island part 33a and the second island part 33b. In the invention, the organic electroluminescence layer 33 need not necessarily be a white type and may be a type in which an organic electroluminescence layer is painted separately in red, green and blue at different sites in order to emit light in the three colors. The organic electroluminescence layer of this type painted separately in the three colors includes a hole injection layer, a hole transport layer on the hole injection layer, an organic light emitting layer on the hole transport layer, an electron transport layer on the organic light emitting layer, and an electron injection layer on the electron transport layer. The light emitting layer is painted in the individual colors. The other layers are the same for red, green and blue, and have the same equal planar layout. Since the layers other than the organic electroluminescence layer 33 can be a moisture entry path, applying the invention is effective. In the case of the separately painted type, the color filter need not be used, and the counter substrate 36 may include a circular polarizer and a touch panel.

A person skilled in the art can readily think of various changes and modifications within the scope of the technical idea of the invention, and such changes and modifications should be understood as falling within the scope of the invention. For example, the addition or deletion of a component, or a design change suitably made to each of the foregoing embodiments by a person skilled in the art, or the addition or omission of a process, or a condition change in each of the embodiment is included in the scope of the invention as long as such change or the like includes the spirit of the invention.

Also, as a matter of course, other advantageous effects that may be achieved by the configurations described in the embodiments should be understood as being achieved by the invention if those effects are clear from the specification or can be readily thought of by a person skilled in the art.

While there have been described what are at present considered to be certain embodiments of the invention, it will be understood that various modifications maybe made thereto, and it is intended that the appended claims cover all such modifications as fall within the true spirit and scope of the invention.

What is claimed is:

1. A display device comprising:
   a resin layer including a display area, where a plurality of lower electrodes is formed, and a peripheral area surrounding the display area, and which has a band-like groove dividing a part surrounding the display area;
   an organic electroluminescence layer, which is formed in the display area and the peripheral area in such a way as to be placed on the plurality of lower electrodes, and which includes a light emitting layer;
   an upper electrode formed on the organic electroluminescence layer; and
   a sealing layer formed in such a way as to cover the organic electroluminescence layer, wherein
   the organic electroluminescence layer is arranged in an inside and an outside of the band-like groove so as to be divided by a boundary of the inside and the outside of the band-like groove and is left in a shape of an island on a bottom surface of the band-like groove, and
   on a bottom surface of the band-like groove, the organic electroluminescence layer is eliminated in a wave shape as viewed in a plan view.

2. The display device according to claim 1, wherein a total elimination width of the organic electroluminescence layer measured in a direction of traversing the band-like groove at a site where the organic electroluminescence layer is left in the shape of an island is broader than an elimination width of the organic electroluminescence layer measured in the direction of traversing the groove at the site where the organic electroluminescence layer is not left in the shape of an island.

* * * * *